US006717486B2

(12) United States Patent
Khemakhem et al.

(10) Patent No.: US 6,717,486 B2
(45) Date of Patent: Apr. 6, 2004

(54) MULTI-CIRCUIT SIGNAL TRANSFORMER

(75) Inventors: M'hamed Anis Khemakhem, Eden Prairie, MN (US); Michael J. Follingstad, Edina, MN (US); Eric L. Lovaasen, Prior Lake, MN (US); Jeffery Louis Peters, Eagan, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/177,639

(22) Filed: Jun. 19, 2002

(65) Prior Publication Data

US 2003/0012362 A1 Jan. 16, 2003

Related U.S. Application Data

(63) Continuation of application No. 09/768,079, filed on Jan. 23, 2001, now Pat. No. 6,597,256.

(51) Int. Cl.[7] .............................. H03H 7/38; H03H 7/42

(52) U.S. Cl. .......................... 333/24 R; 333/25; 333/32; 455/347

(58) Field of Search ................................ 333/24 R, 25, 333/32; 211/40; 361/790; 439/174, 470, 942; 455/347, 348

(56) References Cited

U.S. PATENT DOCUMENTS

| | | | |
|---|---|---|---|
| 3,729,657 A | 4/1973 | Callan et al. | 174/52.1 |
| 5,283,789 A | 2/1994 | Gunnarsson et al. | 370/490 |
| 5,293,298 A | 3/1994 | Foglia | 361/113 |
| 5,677,959 A | 10/1997 | Silfvast | 381/77 |
| 5,774,789 A | 6/1998 | van der Kaay et al. | 455/16 |
| 5,852,655 A | 12/1998 | McHale et al. | 379/93.14 |
| 5,901,340 A | 5/1999 | Flickinger et al. | 725/149 |
| 5,903,829 A | 5/1999 | Anderson et al. | 455/347 |
| 6,049,709 A | 4/2000 | Anderson et al. | 455/347 |
| 6,108,331 A | 8/2000 | Thompson | 370/352 |
| 6,116,961 A | 9/2000 | Henneberger et al. | 439/668 |
| 6,150,896 A | 11/2000 | DeCramer et al. | 333/25 |
| 6,186,798 B1 | 2/2001 | Follingstad et al. | 439/76.1 |
| 6,252,878 B1 | 6/2001 | Locklear, Jr. et al. | 370/401 |
| 6,352,451 B1 | 3/2002 | Henneberger et al. | 439/668 |

FOREIGN PATENT DOCUMENTS

| | | | |
|---|---|---|---|
| DE | 295 21 330 C1 | 2/1997 | H01R/27/00 |

OTHER PUBLICATIONS

Declaration of Michael J. Follingstad including photograph of KABC XLR Patch Panel.
Canare Corporation Catalog.copyright 2000, front cover, pp. 8,9,21, and back cover.
8 photographs of Neutrak AG digital audio impedance transformers, models NADITBNGM and NADITBNC-F.

*Primary Examiner*—Robert Pascal
*Assistant Examiner*—Dean Takaoka
(74) *Attorney, Agent, or Firm*—Merchant & Gould P.C.

(57) ABSTRACT

Multiple digital audio transformer circuits are included in a module for mounting in a chassis. These digital audio transformer circuits are comprised of a front mounted twisted pair digital audio cable connector and a rear mounted coaxial cable connector, with circuitry including baluns electrically linking the front and rear connectors to reduce the impedance of the signal and attenuate the amplitude of the signal voltage. In one embodiment, the module may also include removable attenuation pads accessible through the front face of the module to allow variation of the level of voltage attenuation. The preferred embodiment of the module bi-directional transforms 110 Ohm digital audio signals and 75 Ohm coaxial signals. If transformation of other levels of impedance are desired, modules may also allow for removal and replacement of the baluns. A digital audio transformer system including multi-circuit modules and rack mount equipment chassis is also provided.

16 Claims, 23 Drawing Sheets

MULTI-CIRCUIT SIGNAL TRANSFORMER

This application is a continuation of application Ser. No. 09/768,079, filed Jan. 23, 2001, now U.S. Pat. No. 6,597,256, issued on Jul. 22, 2003, which application is incorporated herein by reference.

FIELD OF THE INVENTION

The present invention relates to telecommunications signal transmission equipment. More particularly, the present invention relates to conversion of signals from balanced twisted pair cables for transmission via unbalanced coaxial cable, and from unbalanced coaxial cables for transmission via balanced twisted pair cables.

BACKGROUND OF THE INVENTION

In the professional audio and video industry, digital audio signals are typically transmitted via balanced twisted pair cables. These twisted pair cables typically operate at a signal impedance of 110 ohms. However, transmitting digital audio signals over longer distances using the balanced twisted pair cable is somewhat problematic. The signal degrades as it passes through the twisted pair cable conductors. Amplification devices to magnify and retransmit the digital audio signals are often required if the digital audio signal transmission length is greater than 150 feet over twisted pair cables.

To address this issue, users are known to pass digital audio signals through a digital audio impedance transformer and transmit the transformed signal via unbalanced coaxial cable at a signal impedance of 75 ohms. Using the unbalanced 75 ohm coaxial cable, the maximum cable distance for transmission without amplification devices can be extended.

The nature of the signal conversion process is such that a single digital audio impedance transformer can handle both unbalanced and balanced signals and the higher and lower impedance conversions. Thus a single transformer can be used to handle bi-directional signal flow.

One known device which handles this signal conversion process is an in-line digital audio transformer for transforming signals between a single twisted pair cable and a single coaxial cable. This in-line device is mounted in the digital audio signal transmission path between cable ends and is then left on the floor or ground subject to environmental exposure and other physical abuse. Often, if multiple circuits with these devices are in one area, organization and identification of the devices can be quite difficult.

Sometimes in these digital audio circuits, voltage attenuation is required, due to an incoming signal with a voltage amplitude beyond the capabilities of a downstream device to handle. This voltage attenuation function can be incorporated into the digital audio transformer device in the form of an attenuation pad. An attenuation pad works by controlling the dB loss in the transformer circuit, thereby moderating the voltage to a more suitable range. The known single circuit in-line devices include attenuation pads of fixed voltage attenuation value within the device. Unfortunately, a fixed attenuation value does not permit alterations of the overall signal transmission environment, if changes are needed. If these transmission environment conditions do change enough to require the alteration of the attenuation value within the in-line digital audio impedance transformer, the entire transformer will need to be switched out to ensure the resulting output voltage is at a proper amplitude for the downstream device.

The known in-line transformer devices typically have a coaxial connector on the coaxial cable side and an XLR connector on the twisted pair side. XLR connectors are relatively expensive compared to alternative connectors, but XLR connectors have traditionally been used in transmitting audio signals. The known in-line devices are also typically cylindrical or barrel-shaped and have machined housings. Manufacture and assembly of such devices is labor intensive and therefore more costly.

Further improvements are desired for signal transformers, such as for digital audio signal transmission systems to address the above concerns or other concerns.

SUMMARY OF THE INVENTION

In one aspect of the present invention, a transformer module includes one or more impedance transformer circuits in a chassis-mountable housing with connectors mounted on the front and rear of the module for attaching twisted pair wires and coaxial wires, and circuitry including baluns connecting pairs of front and rear connectors. The circuitry may include removable attenuation pads adjacent to one of the connectors of the circuit to which the attenuation pad is attached. The circuitry may include provisions for the baluns to be removably inserted, so that baluns of different impedance levels may be utilized. The module may also have a cable clip adjacent to the connectors to aid in cable management.

A further aspect of the present invention includes providing a digital audio impedance system made up of a plurality of the digital impedance transformer modules of the present invention mounted in a chassis.

Another aspect of the present invention is to provide a multi-circuit impedance transformer module for use with a chassis with linearly arrayed connectors mounted on opposite faces of the module with transformer circuits including baluns. Attenuation pads can be mounted adjacent to one of the sets of connectors.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of the description, illustrate several aspects of the invention and together with the description, serve to explain the principles of the invention. A brief description of the drawings is as follows.

DETAILED DESCRIPTION

Reference will now be made in detail to exemplary aspects of the present invention which are illustrated in the accompanying drawings. Wherever possible, the same reference numbers will be used throughout the drawings to refer to the same or like parts.

Figure 1:
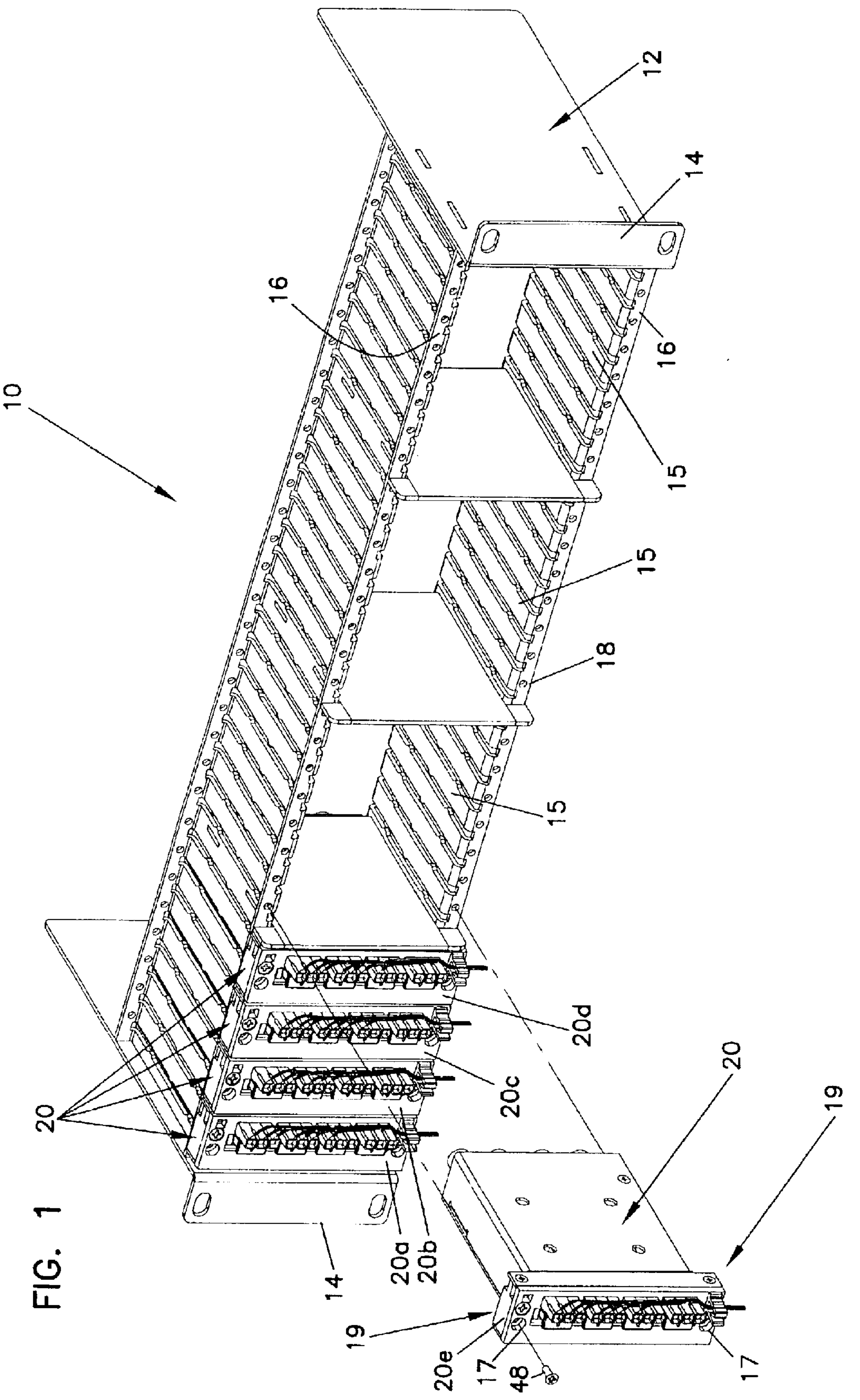
FIG. 1 is a perspective view of a preferred embodiment of a system in accordance with the present invention showing a chassis partially loaded with a plurality of multi-circuit modules and another multi-circuit module in position for insertion.
Figure 2:
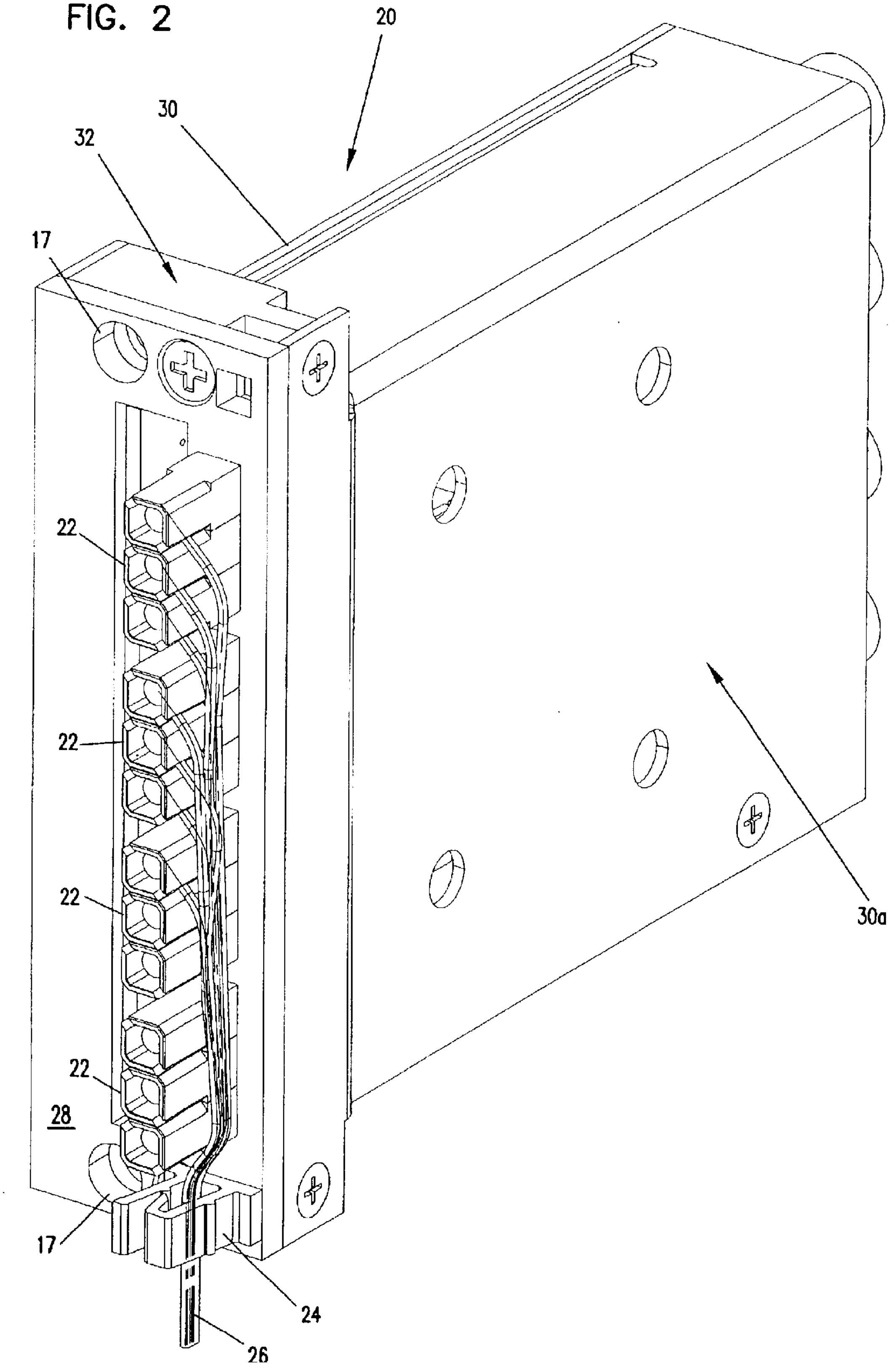
FIG. 2 is a front perspective view of a multi-circuit module with front QCP twisted pair connectors, rear BNC coaxial connectors and a front cable clip.

Referring now to FIG. 1, one embodiment of a transformer system 10 includes a chassis 12 and a plurality of multi-circuit modules 20. Modules 20*a–d* are shown mounted to the chassis 12, with module 20*e* shown in position to be slidably inserted into chassis 12. Chassis 12 in the illustrated embodiment is capable of housing up to 16 of the multi-circuit modules 20, as shown in FIG. 1. Chassis 12 can be made to conform to standard international format (approximately 19" width), standard U.S. format (approximately 23" width), or any other desired frame, rack or cabinet configuration. Chassis 12 includes a flange 14 on each end for securing the chassis to a support structure, such as an equipment cabinet for holding further chassis 12 and other equipment. Module bays 15 of chassis 12 are for slidably receiving multi-circuit modules 20. Module flanges 16 are for securing multi-circuit modules 20 to chassis 12, using threaded fasteners 48 inserted through module mounting openings 17 in flanges 19 of the modules 20 and threadably received by threaded mounting openings 18 on flanges 16.

Multi-circuit modules 20 can be mounted to any convenient frame, rack or cabinet support structure through flanges 19 or other structure. Multi-circuit modules 20 include multiple transformer circuits each for transforming a signal from a balanced twisted pair signal to an unbalanced coaxial signal. Alternatively, module 20 may, if desired, be constructed as a single circuit device. Module 20 includes connectors on one side (the front in the example embodiment) for connecting to balanced twisted pair cables. Module 20 includes further connectors on a further side, preferably the opposite side (rear in the example embodiment) for connecting to unbalanced coaxial cables.

Modules 20 with chassis 12 can be used in a communications system where the cabinet holds not only chassis 12, but other related equipment such as switching jacks of a patch panel.

Figure 4B:
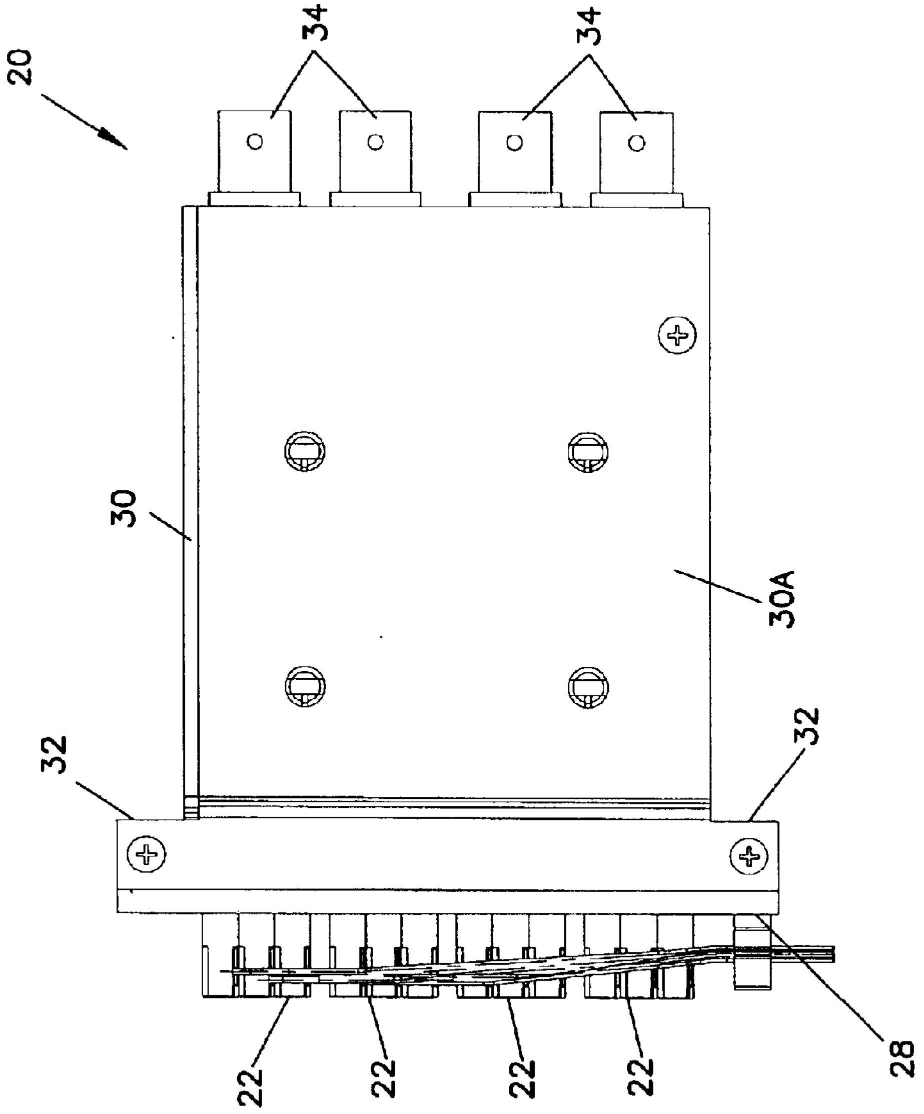
FIGS. 4A–D are front, side, top, and rear views, respectively, of the multi-circuit module of FIG. 2.
Figure 4A:
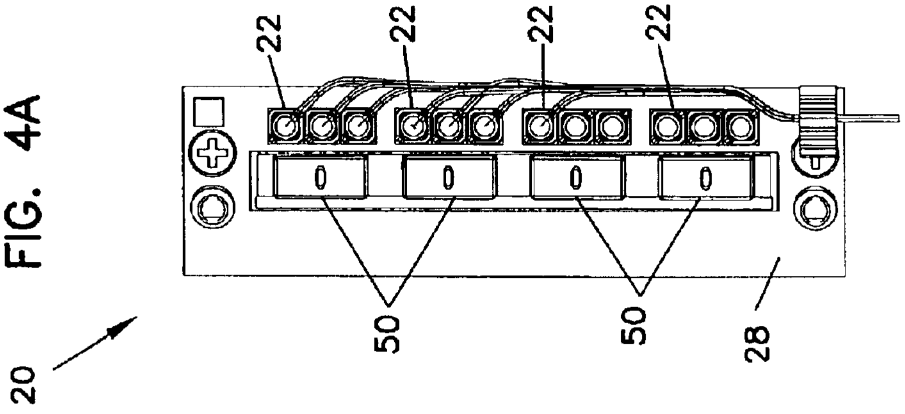
Figure 4D:
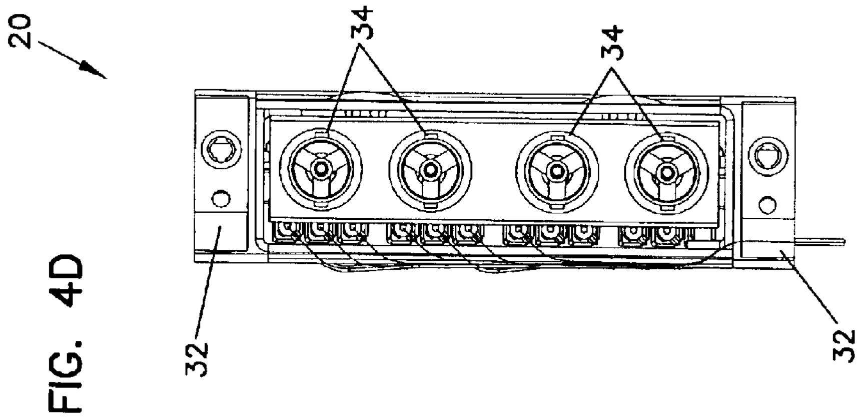
Figure 4C:
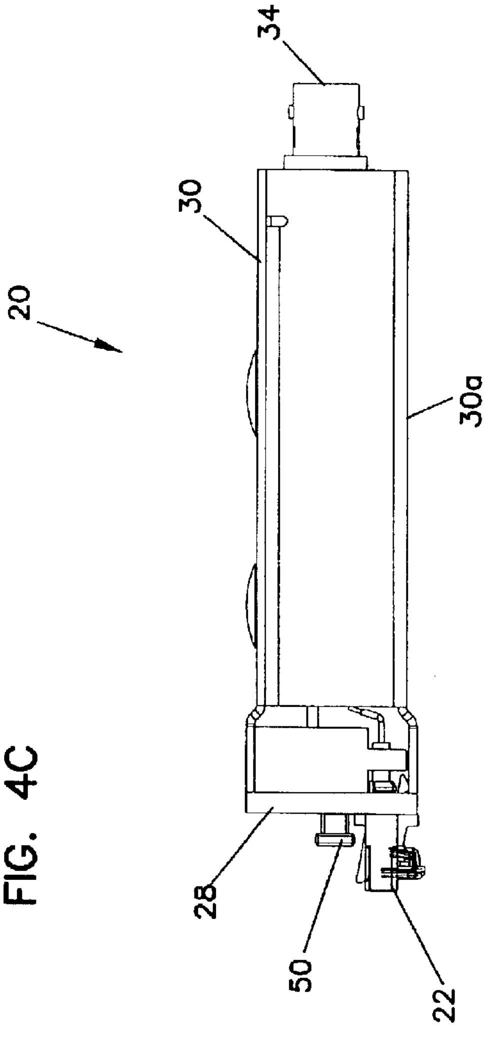
Figure 5:
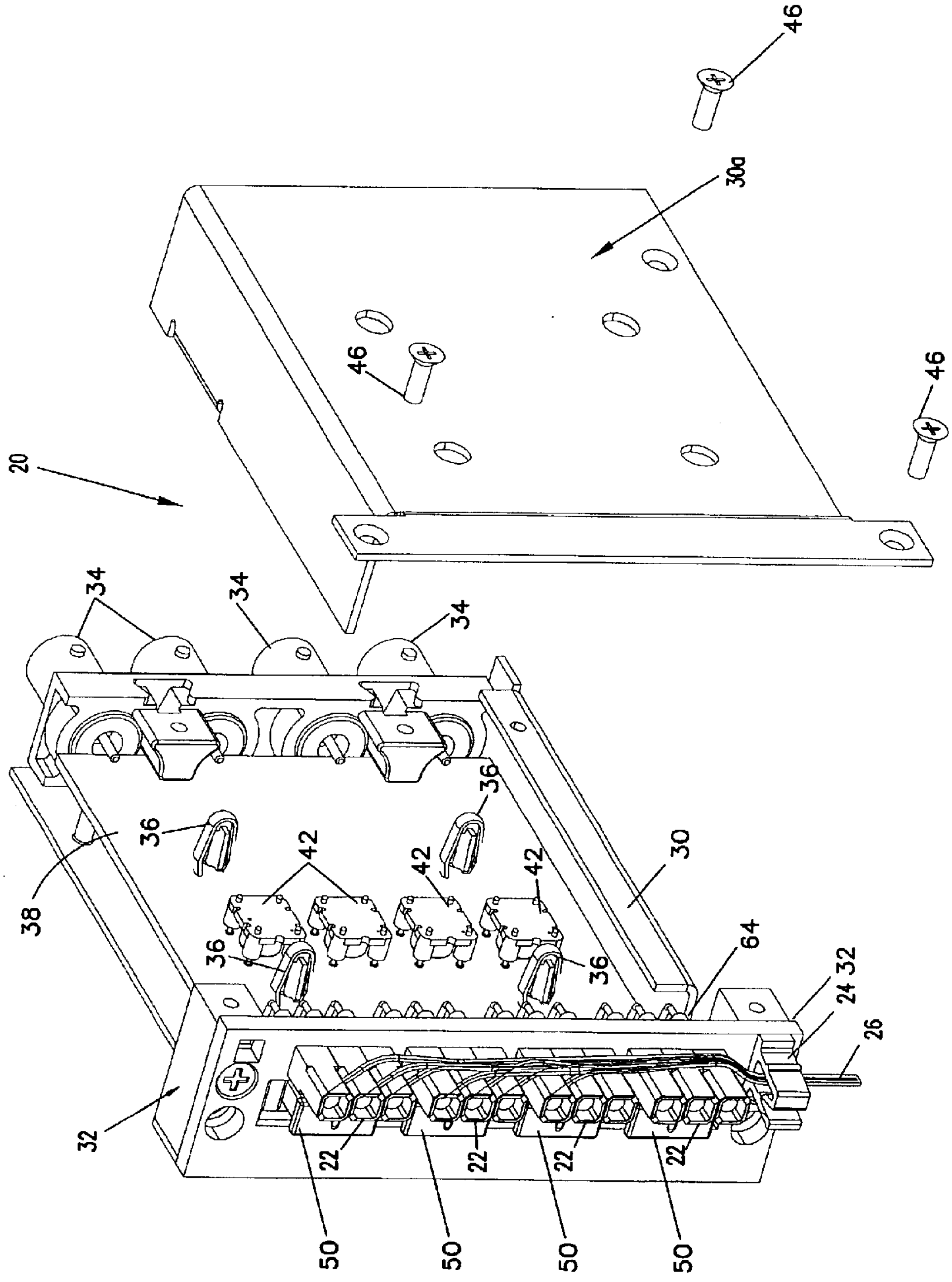
FIG. 5 is a partially exploded front perspective view of the multi-circuit module of FIG. 2.
Figure 6:
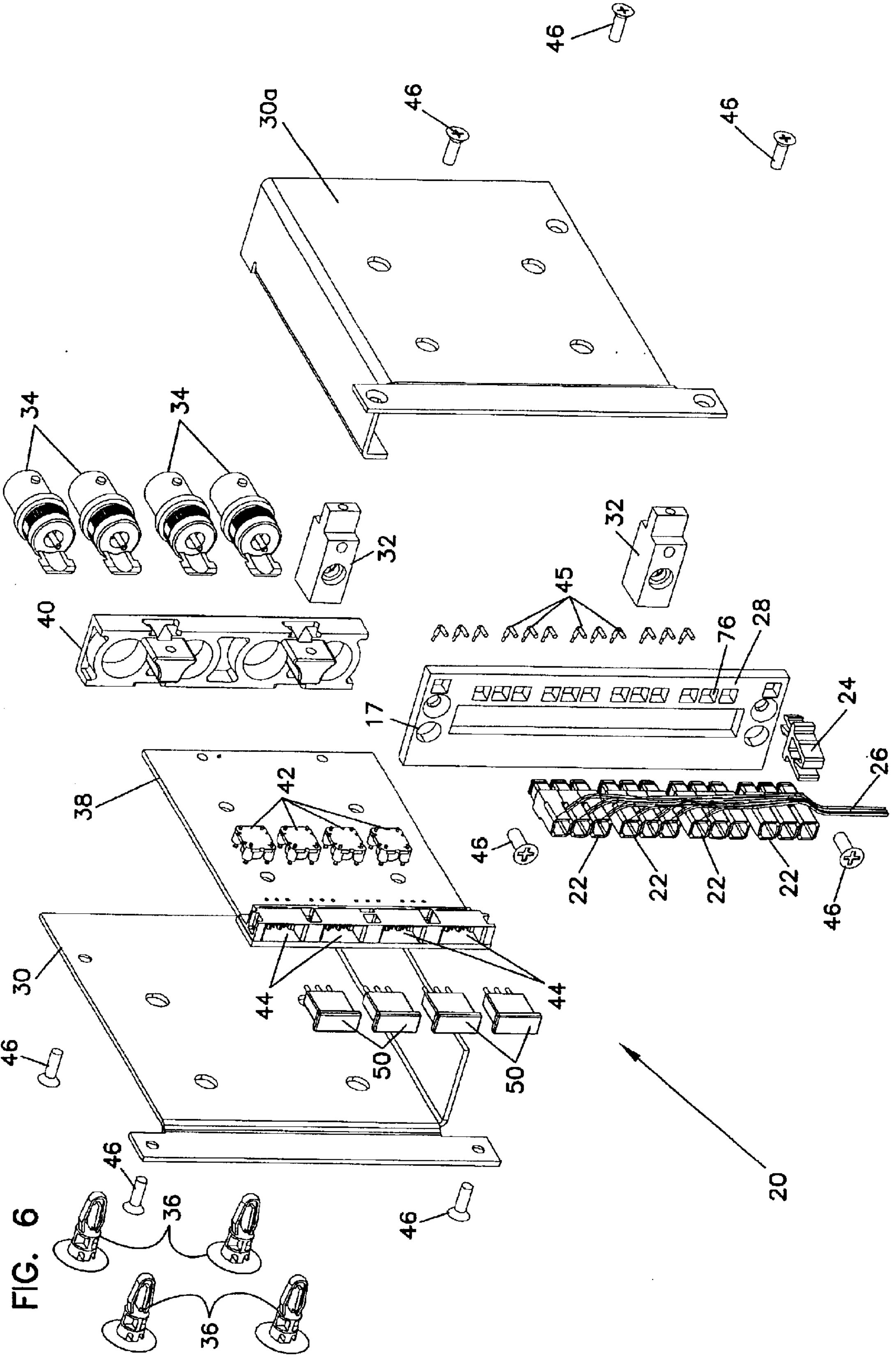
FIG. 6 is an exploded front perspective view of the multi-circuit module of FIG. 2, with some items removed for drawing clarity.
Figure 7:
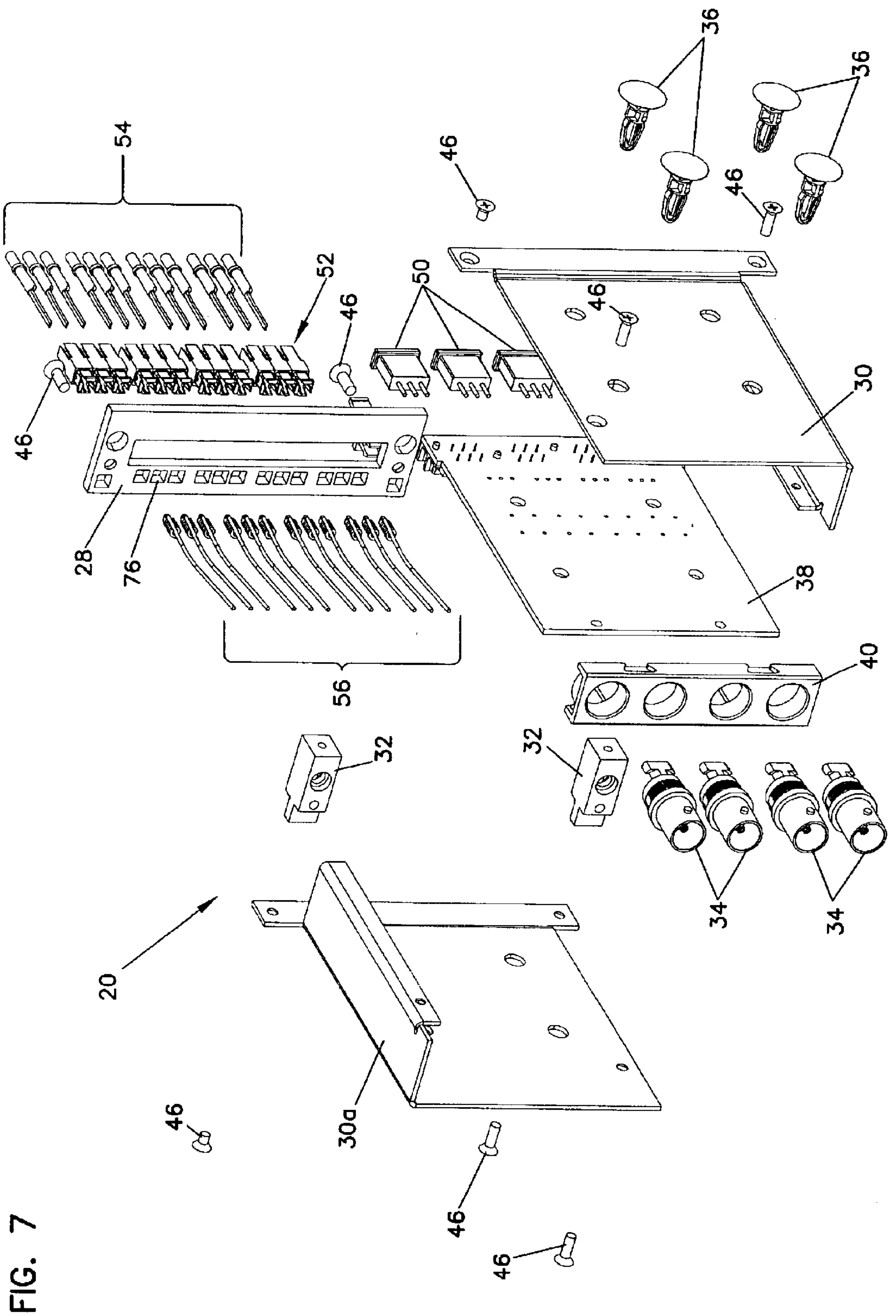
FIG. 7 is an exploded rear perspective view of the multi-circuit module of FIG. 2.
Figure 8:
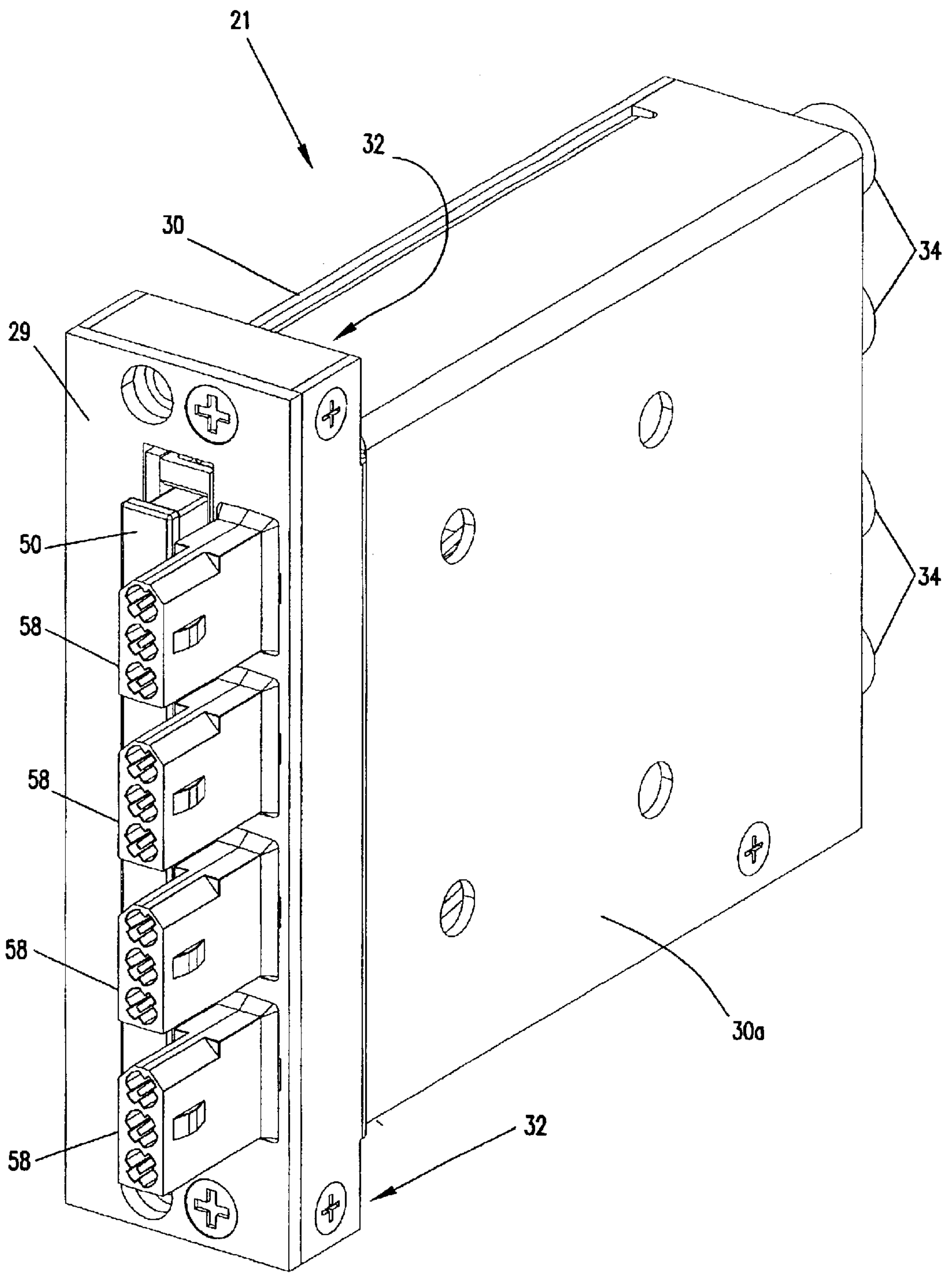
FIG. 8 is a front perspective view of a second embodiment of a multi-circuit module with front 3-pin twisted pair connectors and rear BNC coaxial connectors.
Figure 9B:
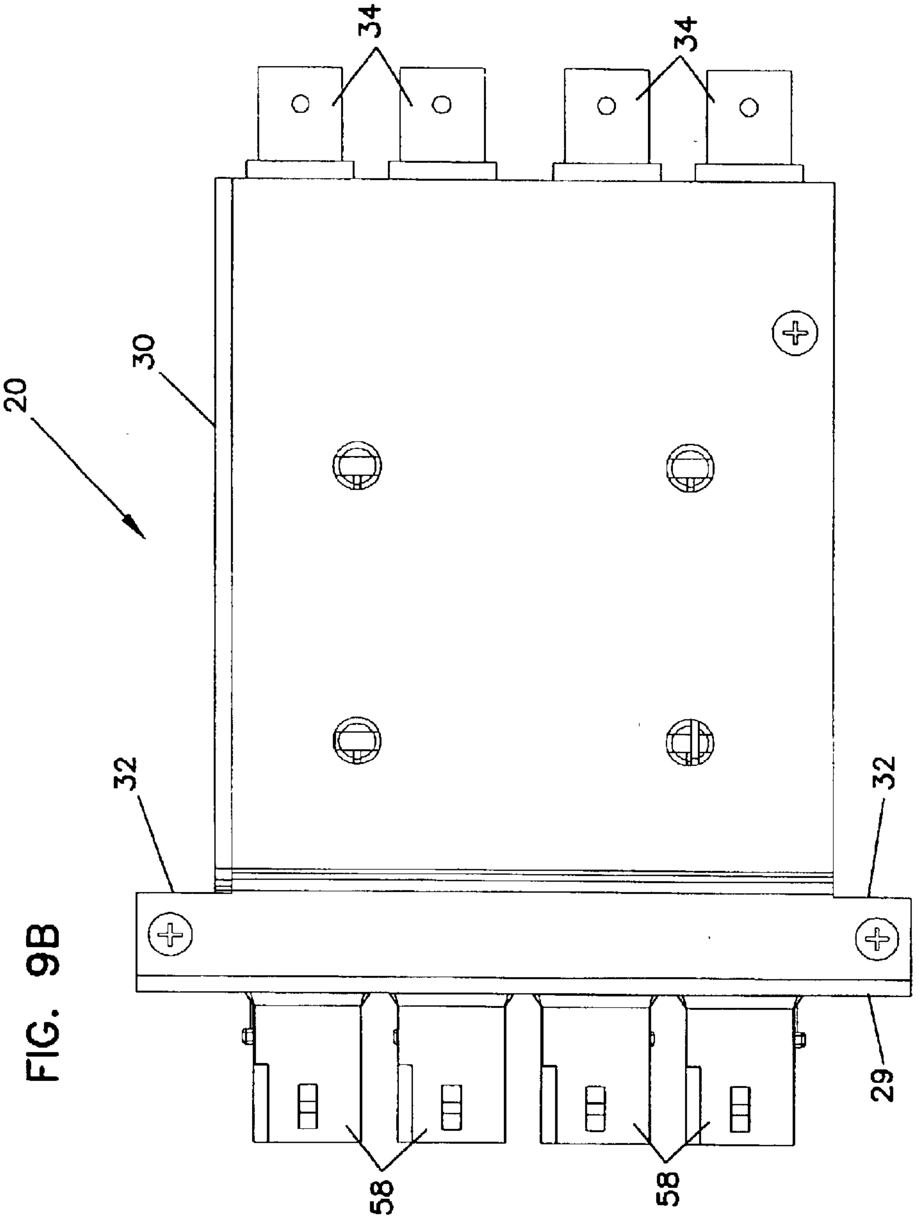
FIGS. 9A–D are front, side, top, and rear views, respectively, of the multi-circuit module of FIG. 8.
Figure 9A:
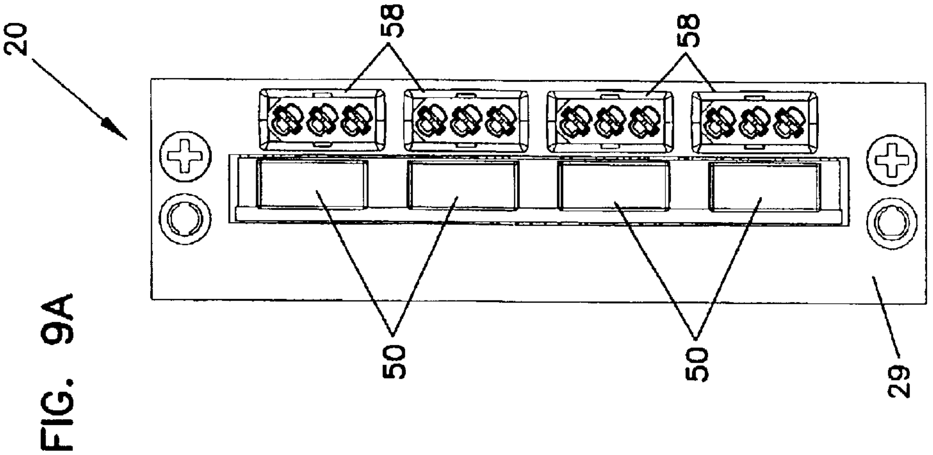
Figure 9D:
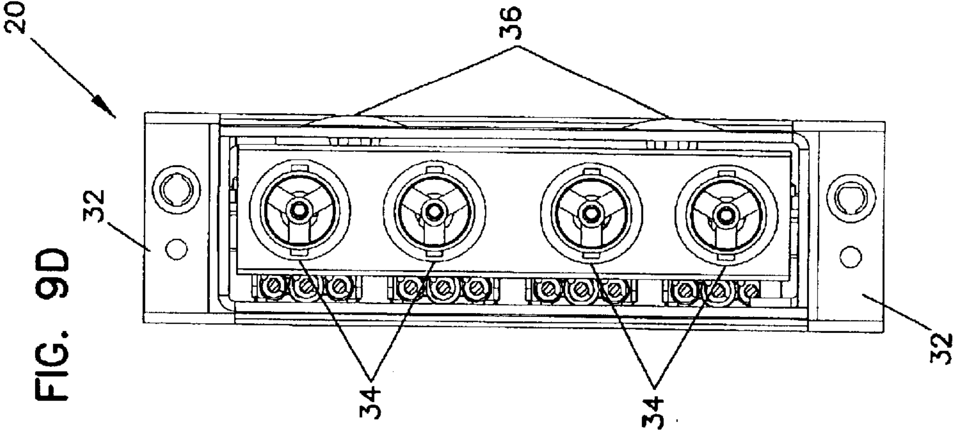
Figure 9C:
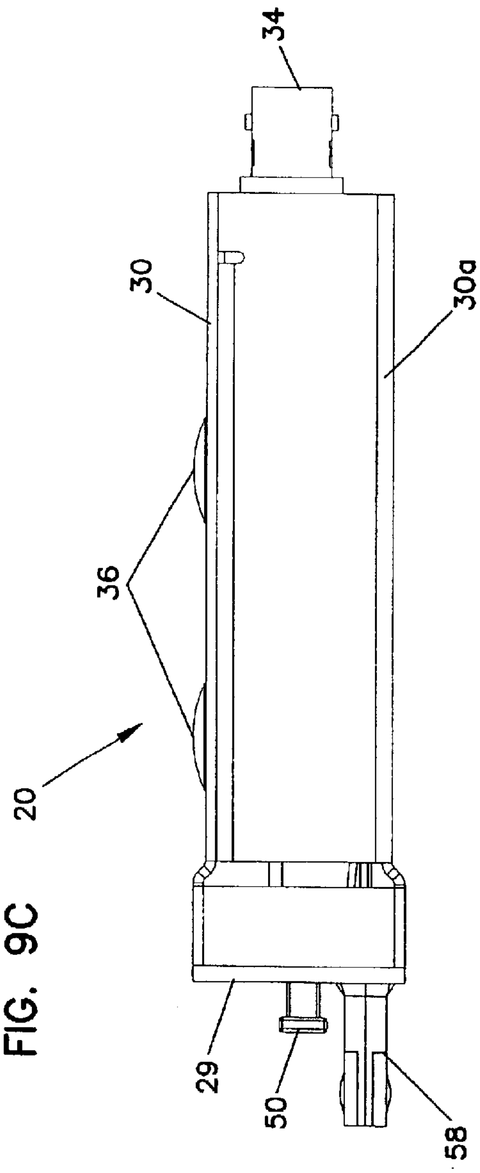
Figure 10:
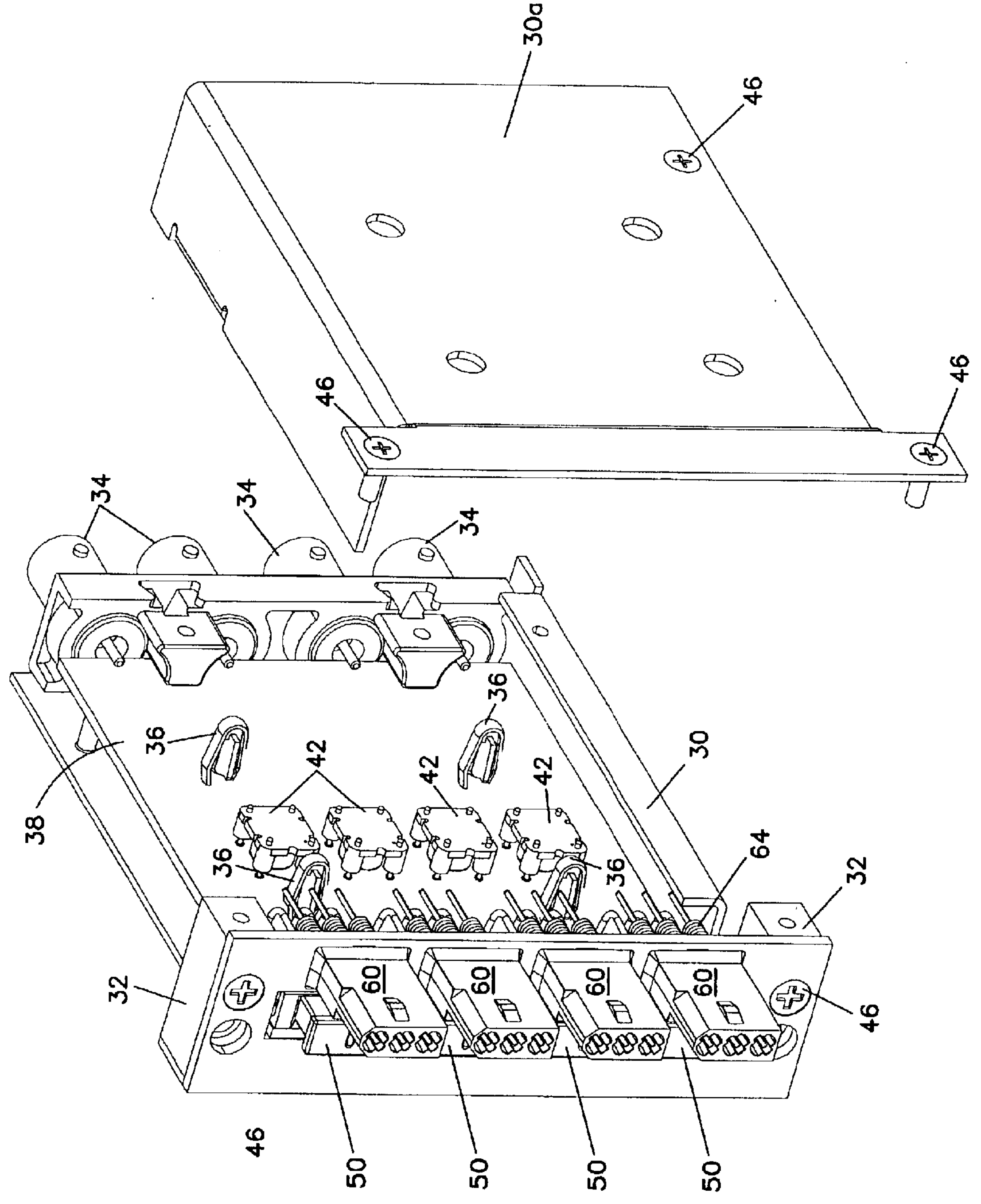
FIG. 10 is a partially exploded front perspective view of the multi-circuit module of FIG. 8.

Now referring to FIGS. 2 through 7 and FIGS. 13A–D, multi-circuit module 20 includes main housing components 30 and 30*a*, and a front face 28. Housing components 30 and 30*a*, detailed in FIG. 13, are shaped such that the two housing components 30 and 30*a* are identical. When components 30 and 30*a* are appropriately oriented and fastened to each other, they form the sides, top and bottom of module 20. As shown in FIGS. 5 through 7, when viewed from the front, the left housing component 30 will receive several stand-off circuit board mounts but is otherwise identical, except for orientation, to the right housing component 30*a*. A flange block 32 is sized to permit mounting to chassis 12, as shown in FIG. 1. On the front face 28 is mounted a cable clip 24, which holds twisted pair cables 26 to the side of each module 20 and direct the cables to reduce obstruction and visual clutter in front of the front connectors of module 20. Mounted through the front face 28 are four twisted pair connectors 22. Each front connector 22 in the embodiment shown is a QCP type of twisted pair cable connector, with three posts for attaching to the three wires of a twisted pair digital audio cable (tip, ring, ground). Other three pin or wire connector types, such as 3-pin plugs, insulation displacement connectors, XLR connectors or XLB connectors could also be used.

Figure 3:
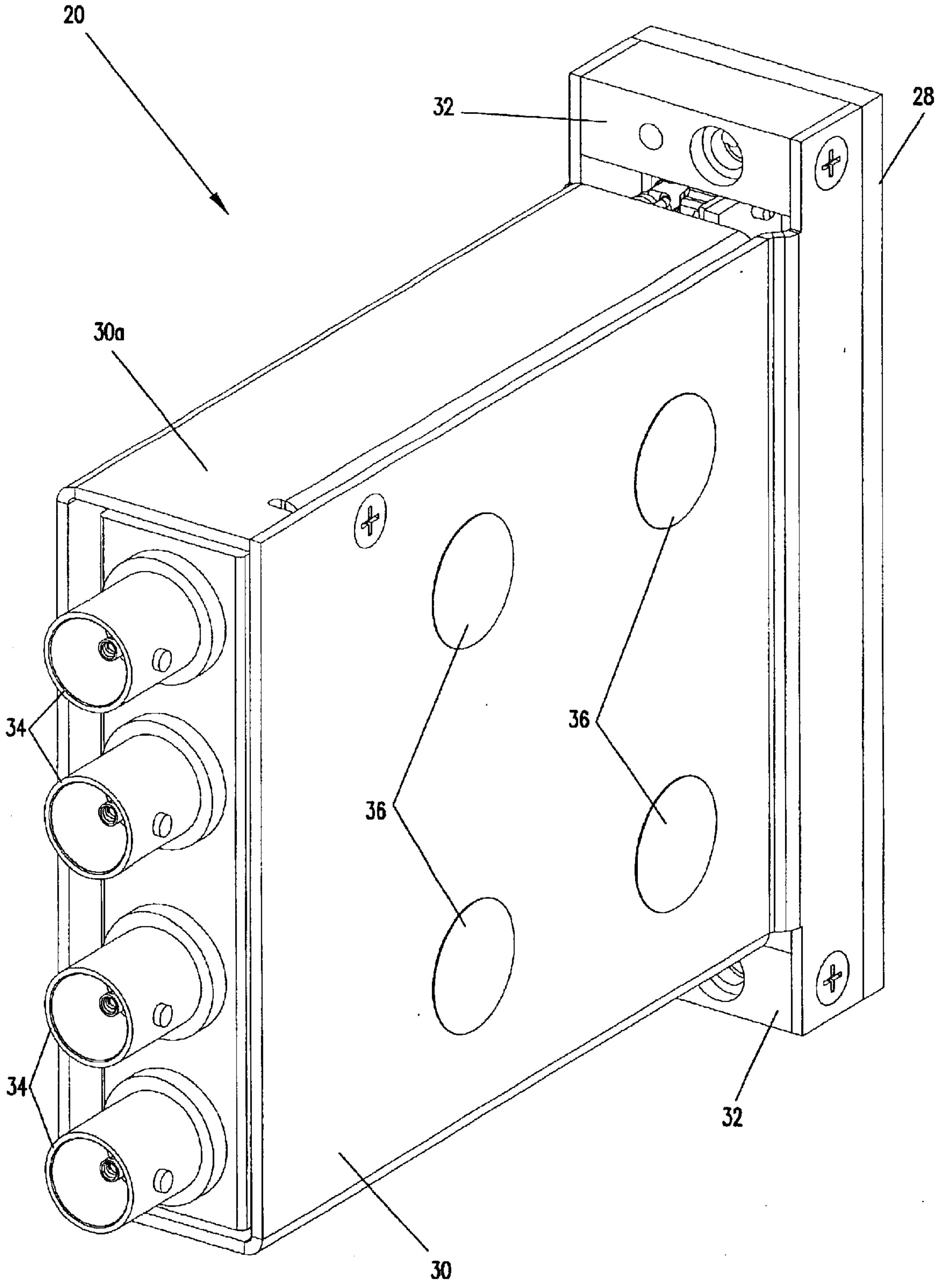
FIG. 3 is a rear perspective view of the multi-circuit module of FIG. 2.

Illustrated in FIG. 3 are stand-off circuit board mounts 36, flange blocks 32 and rear coaxial connectors 34. The rear connectors in the embodiment shown are BNC type. Other types of coaxial connectors, such as F-connector, 1.6–5.6, SMB, MCX, Twinax or 7–16 DIN could also be used for the rear connectors for connecting to the coaxial cable (center conductor and ground).

In FIGS. 4A and 4C, four attenuation pads 50 are shown inserted through front face 28. In FIGS. 4B, 4C and 4D, four BNC connectors 34 are shown at the rear of module 20.

In FIGS. 5 through 7, stand-off circuit board mounts 36 are mounted to and project through left housing component 30 and hold circuit board 38 at a fixed position within module 20. Board 38 is shown parallel to the sides of module 20. Other orientations are possible, such as transverse. Other circuitry can be used such as flex-circuitry.

Symmetrically designed housing components 30 and 30*a* can be seen cooperating to form the external sides, top and bottom of module 20. Flange blocks 32 are mounted between housing components 30 and 30*a* to provide support to front face 28 and provide mounting flanges for mounting module 20 within a chassis 12, as shown in FIG. 1. Fastener 48 inserts through module mounting opening 17 in front face 28 and flange block 32 to mount module 20 to chassis 12. Cable clip 24 is insertably mounted to front face 28. Rear connector face 40 is mounted between housing components 30 and 30*a* and to the rear of circuit board 38. Attenuation pad sites 44 are mounted at the front of circuit board 38. Baluns 42 are mounted to circuit board 38 in an intermediate position between rear connector face 40 and attenuation pad sites 44. Attenuation contacts 45 are mounted to circuit board 38 and electrically connect attenuation pads 50 to circuit board 38. QCP connectors 22 are shown with twisted pair cables 26 inserted. Screws 46 are used to assemble module 20.

FIG. 7 includes those components removed for clarity from FIGS. 5 and 6. In addition to the items shown in FIGS. 5 and 6, the components comprising QCP connectors 22 are shown. These components are the QCP housings 52, QCP posts 54 and QCP contacts 56. QCP contacts 56 electrically connect twisted pair cables 26 (cables shown in earlier FIGS.), which are electrically connected to QCP posts 54, to circuit board 38. Circuit board 38 includes conductor pathways which are not illustrated here, but which electrically connect, in order, QCP contacts 56 to baluns 42, baluns 42 to attenuation contacts 45, and attenuation contacts 45 to BNC connectors 34. BNC connectors 34 are mounted on rear connector face 40, and permit connection of coaxial cables to module 20.

Now referring to FIGS. 8 through 12, these FIGS. detail an alternative embodiment of a multi-circuit module, module 21, wherein the front mounted digital audio connectors are 3-pin connectors 58, and the front face 29 is configured to accept 3-pin connectors 58. All other external aspects of module 21 are as described above in reference to module 20.

Figure 11:
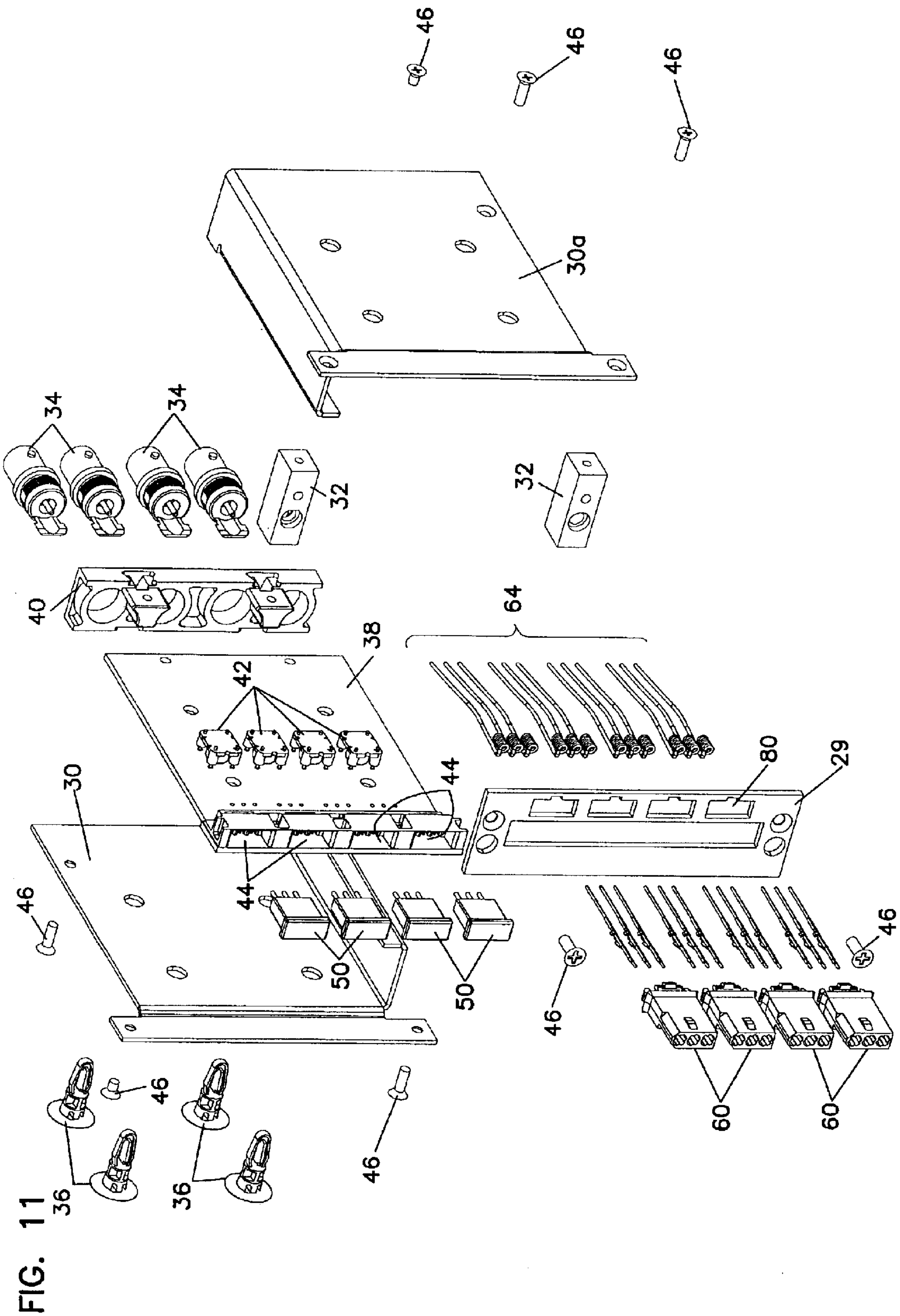
FIG. 11 is an exploded front perspective view of the multi-circuit module of FIG. 8.
Figure 12:
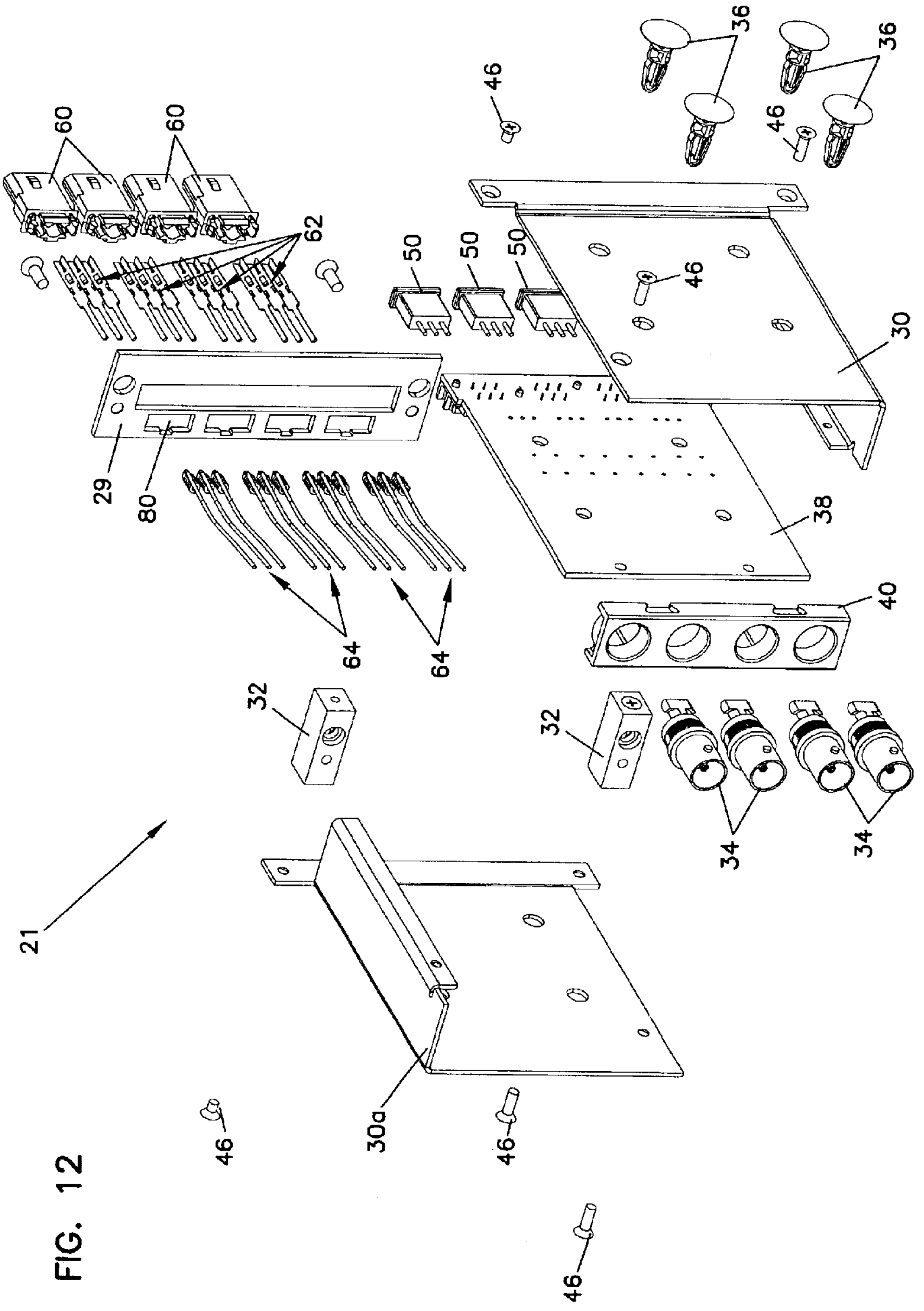
FIG. 12 is an exploded rear perspective view of the multi-circuit module of FIG. 8.
Figure 13B:
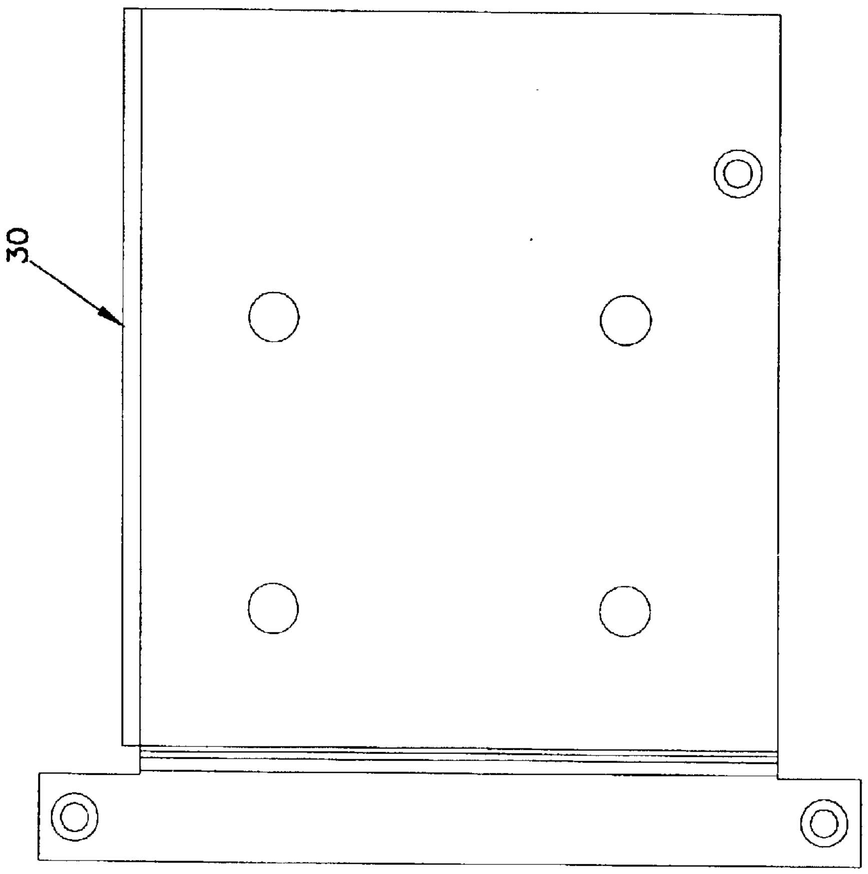
FIGS. 13A–D are front, side, top, and rear views, respectively, of the housing component for the multi-circuit modules of FIGS. 2 and 8.
Figure 13A:
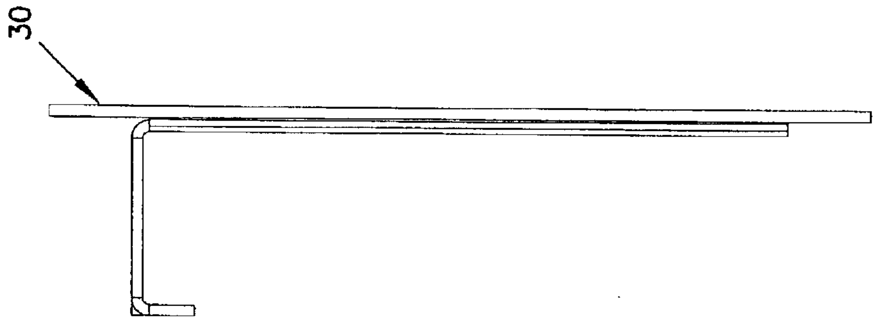
Figure 13D:
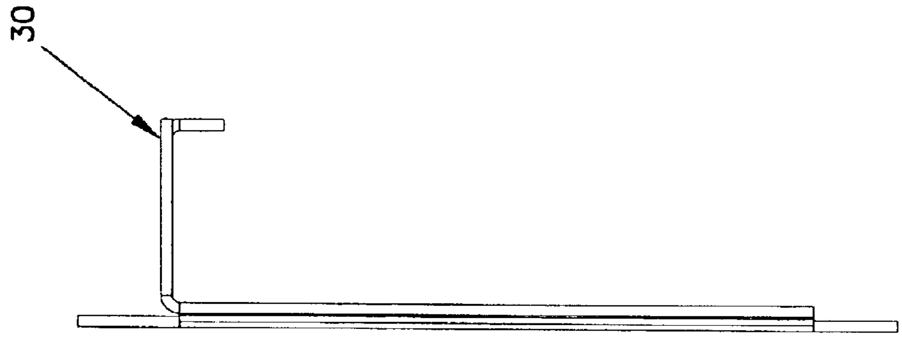
Figure 13C:
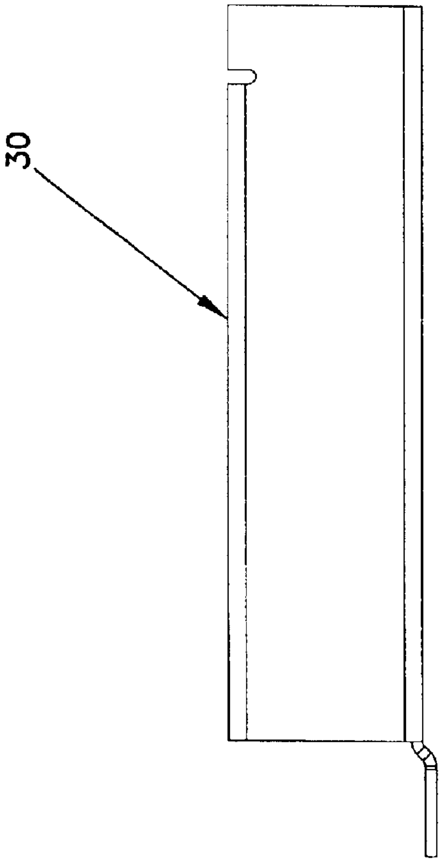
Figure 14B:
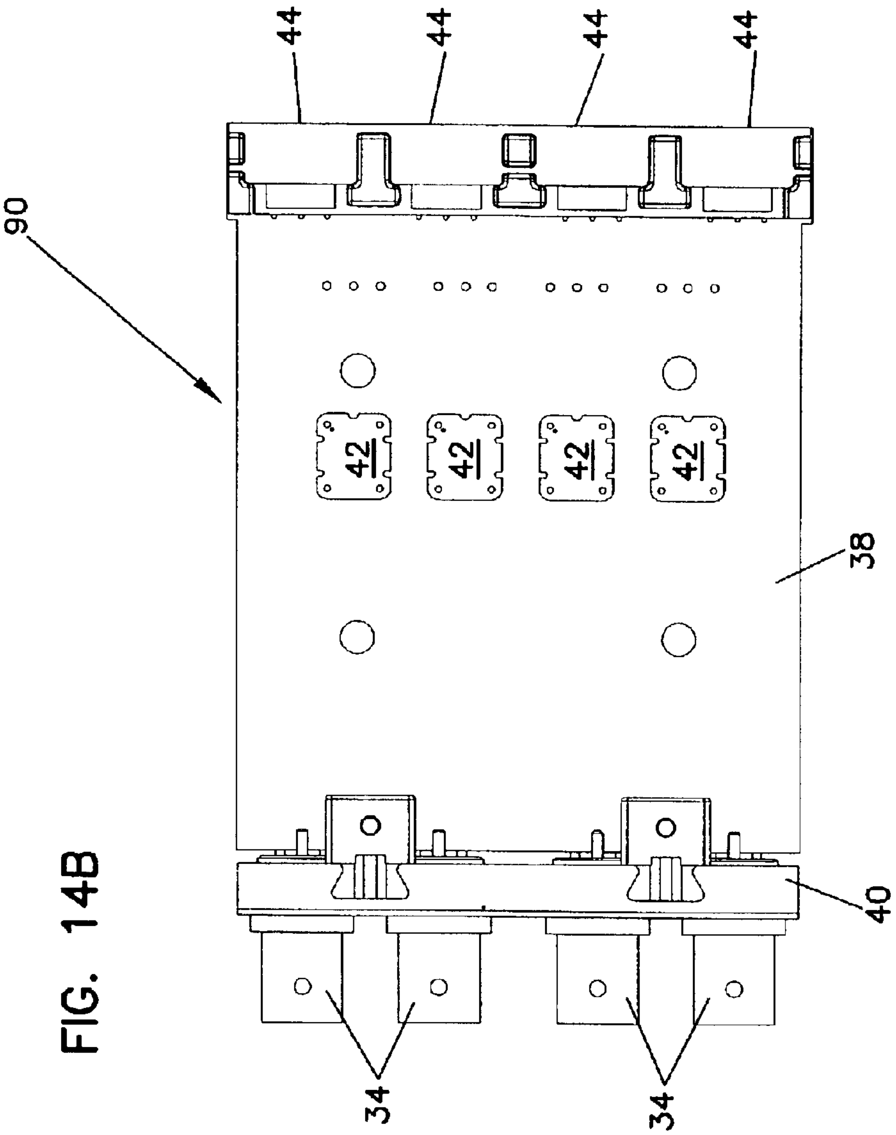
FIGS. 14A–D are front, side, top, and rear views, respectively, of a circuit board subassembly for the multi-circuit modules of FIGS. 2 and 8.
Figure 14A:
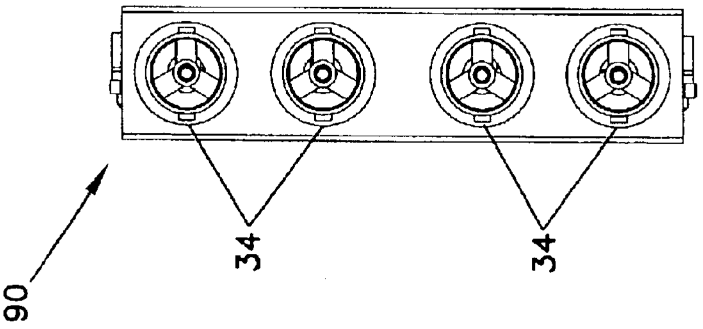
Figure 14D:
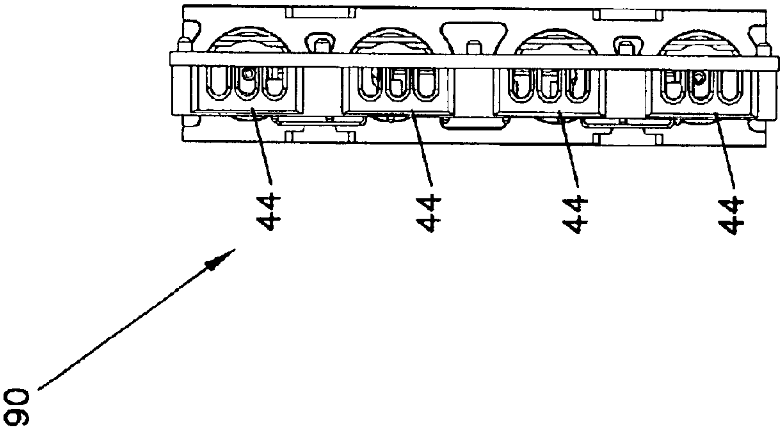
Figure 14C:
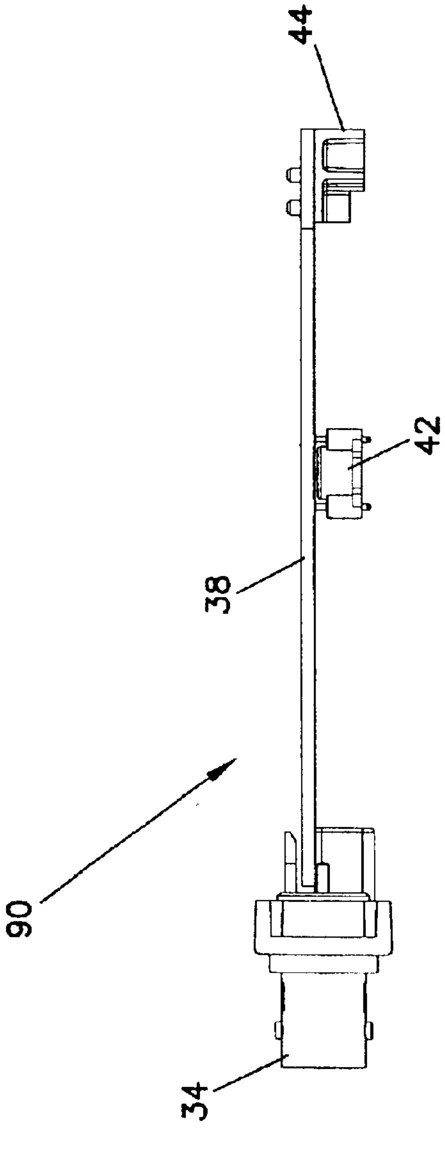
Figure 15A:
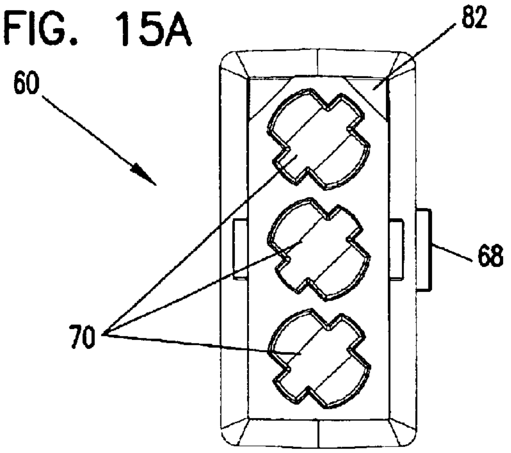
FIGS. 15A–E are front, side, top, rear and perspective views, respectively, of a 3-pin twisted pair connector housing.
Figure 15B:
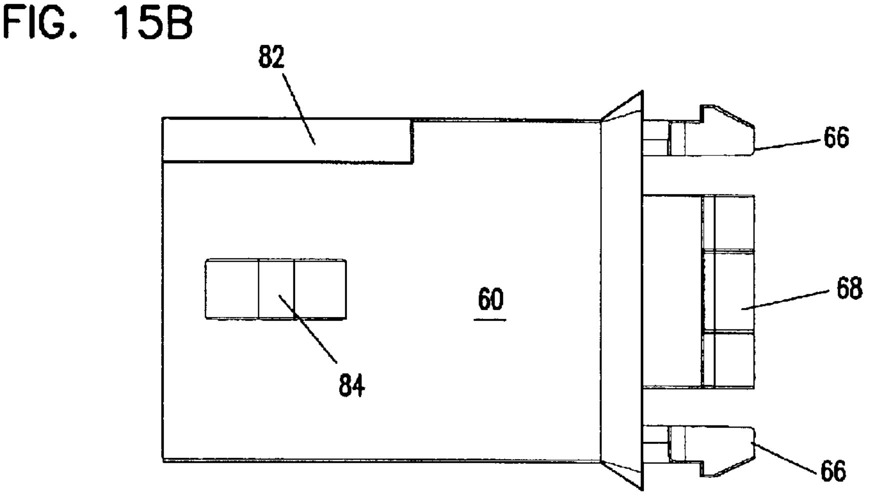
Figure 15C:
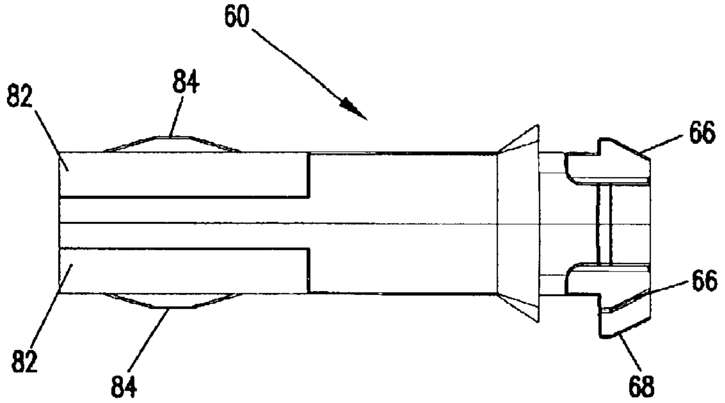
Figure 15D:
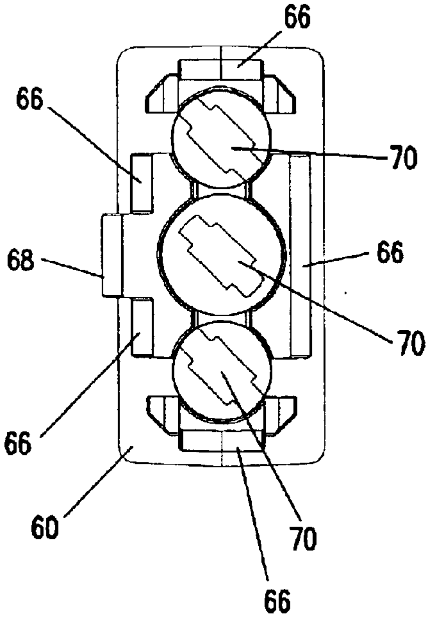
Figure 15E:
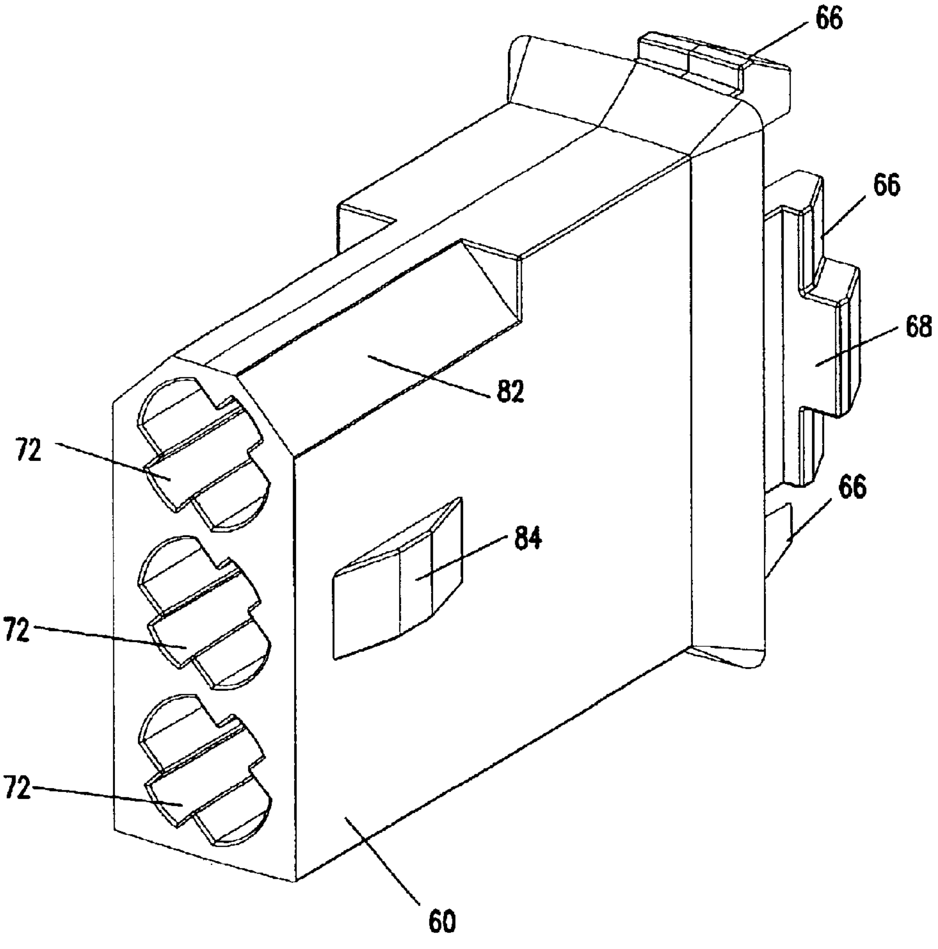

In FIGS. 11 and 12, 3-pin housings 60 are mounted to front face 29. 3-pin posts 62 extend through 3-pin housings 60 (3-pin housing 60 is described below with regard to FIGS. 15A–E) and are electrically connected with 3-pin contacts 64. 3-pin contacts 64 electrically connect with the conductor pathways of circuit board 38. Conductor pathways on circuit board 38 are electrically configured as described above in reference to module 20. 3-pin housings 60 each receive a 3-pin connector plug mounted to the twisted pair cable.

FIGS. 13 A–D illustrates housing components 30 and 30*a*, which are constructed and formed to be identical, such as from sheet metal. The design of these components is such that two identical housing components may be combined to full enclose the sides, top and bottom of a module 20, as shown in multiple FIGS. above, avoiding the need for design and manufacture of multiple different housing elements.

Referring now to FIGS. 14A–D, the circuit board subassembly 90 includes circuit board 38, with baluns 42 installed. BNC connectors 34 and rear connector face 40 are mounted to the rear of circuit board 38, and attenuation pad sites 44 are mounted to the front of circuit board 38.

Figure 17:
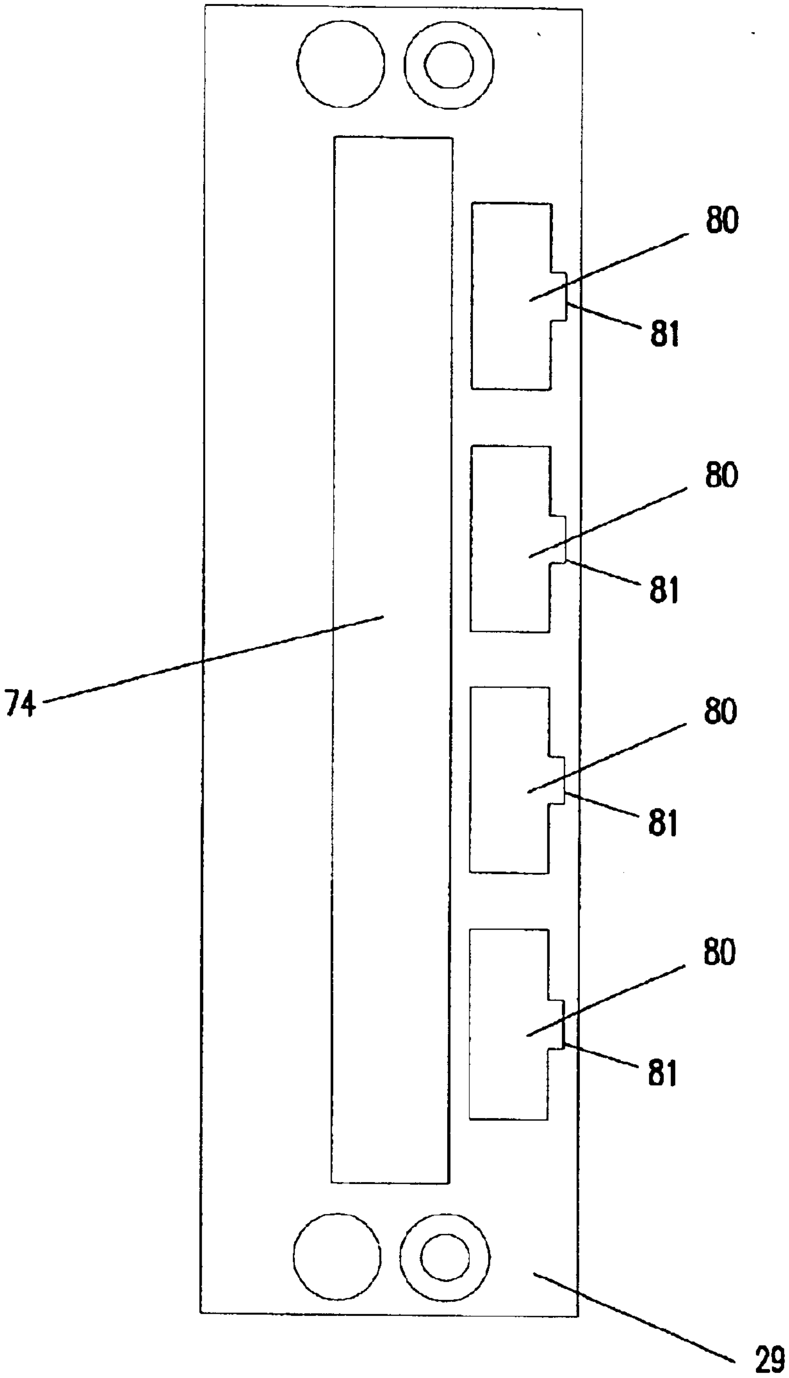
FIG. 17 is a front view of the front face of the housing for the multi-circuit module of FIG. 8 adapted for front 3-pin twisted pair connectors and with an opening for removable attenuation pads.

FIGS. 15A–E illustrates the details of 3-pin housing 60. 3-pin housing 60 is formed from an elastically deformable material, such as plastic. To retainably mount 3-pin housing 60 to front face 29, 3-pin housing 60 is inserted through 3-pin connector opening 80 so that key flange 68 passes through index notch 81 (index notch 81 is shown in FIG. 17). Locking flanges 66 and key flange 68 are compressed as they pass through 3-pin connector opening 80 and then spring back to shape once they pass through the 3-pin connector opening 80, serving to retain 3-pin housing 60 to front face 29. Post openings 70 extend through the length of 3-pin housing 60, allowing for insertion of 3-pin post 62 through 3-pin housing 60. Plug openings 72 extending partially through 3-pin housing 60 and permit the insertion of a mating 3-pin plug to connect digital audio cables to module 21. Index flats 82 cooperate with a mating 3-pin plug to ensure proper orientation for insertion and retention tabs 84 cooperate with a mating plug to help retain the mating plug to module 21 upon insertion into 3-pin housing 60.

Figure 16:
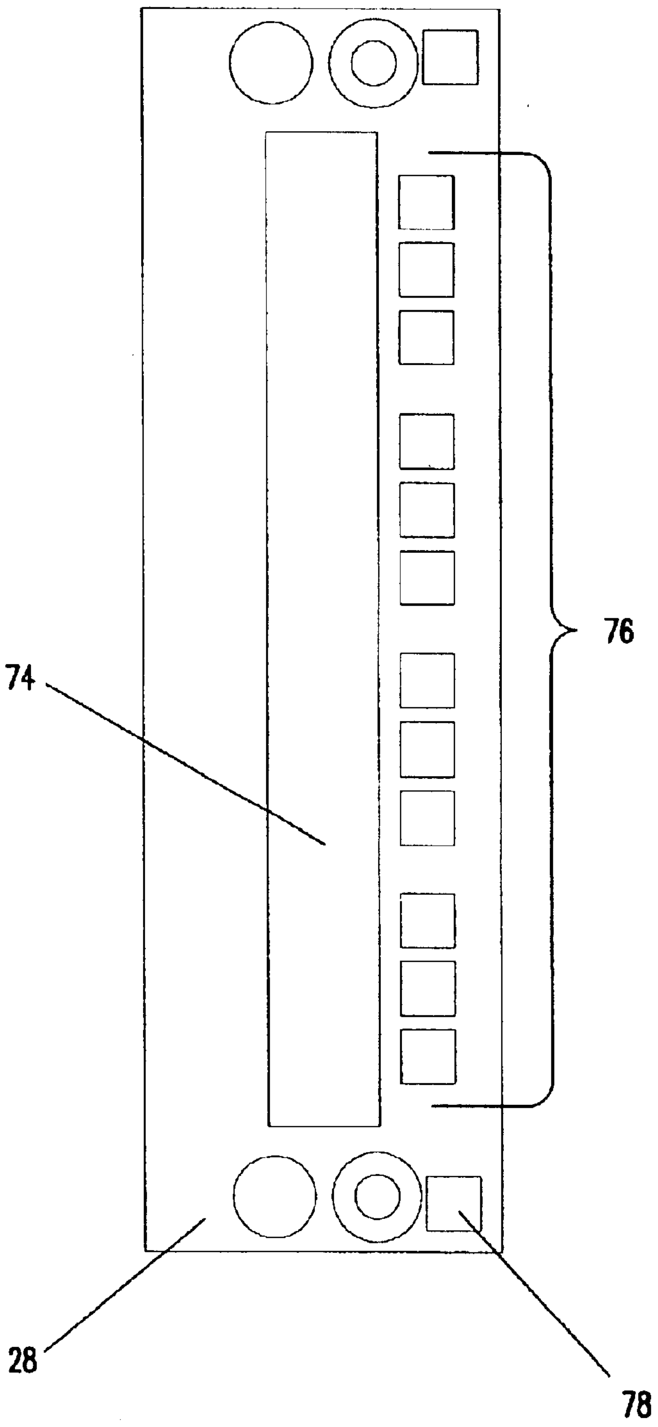
FIG. 16 is a front view of the front face of the housing for the multi-circuit module of FIG. 2 adapted for front QCP twisted pair connectors and with an opening for removable attenuation pads.

FIG. 16 illustrates front face 28, including QCP connector openings 76 for mounting QCP connectors 22, and attenuation pad site access opening 74. FIG. 17 illustrates front face 29, including 3-pin connector openings 80 for mounting 3-pin connectors 58. Index notch 81 cooperates with key flange 68 to ensure correct mounting orientation of 3-pin connectors 58. Attenuation pad site access opening 74 is also shown. Aperture 78 receives cable clip 24.

Figure 18:
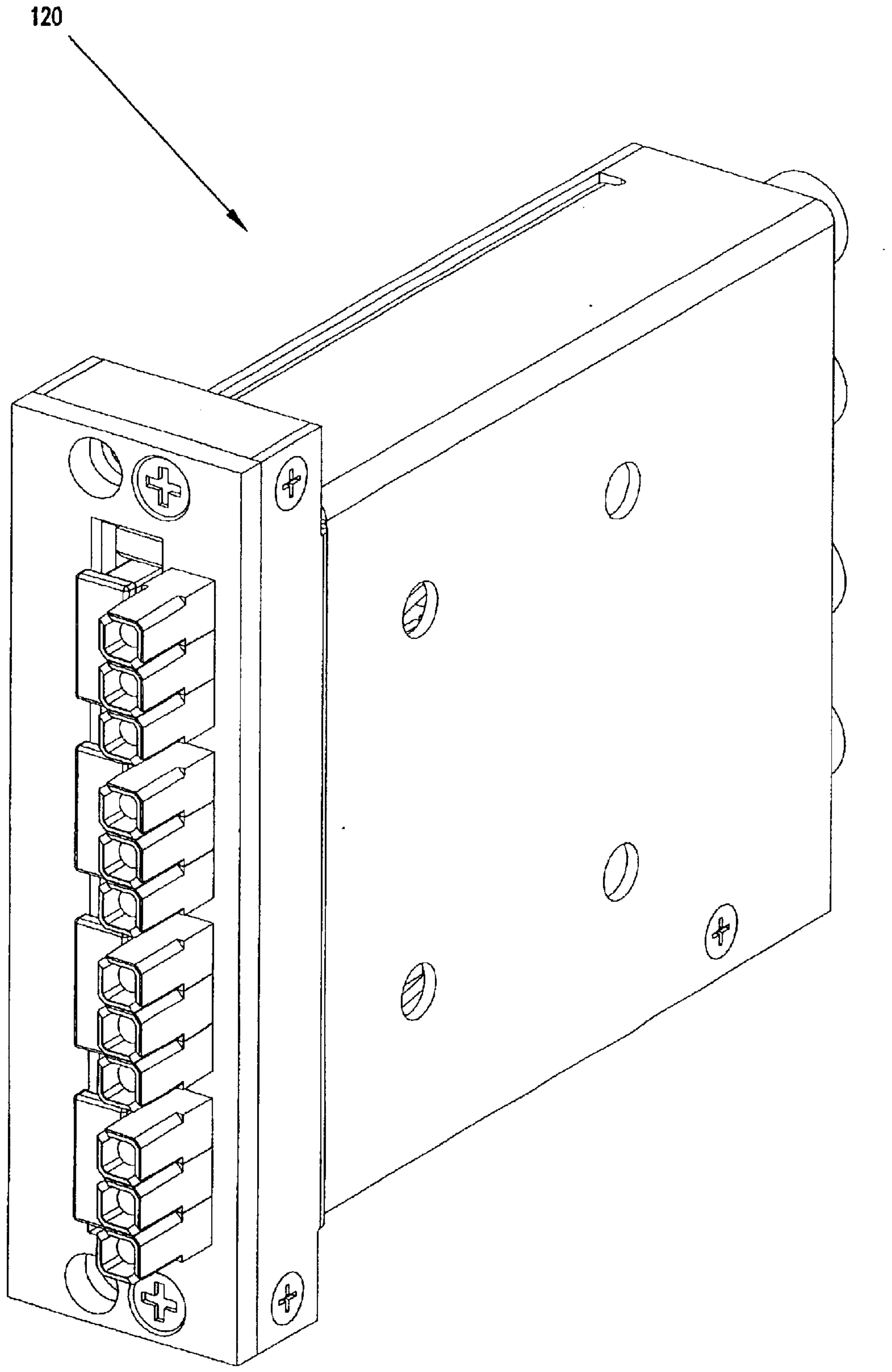
FIG. 18 is a front perspective view of a further alternative embodiment of a multi-circuit module with front QCP connectors and without the front cable clip.

An alternative embodiment module 120 is shown in FIG. 18. Module 120 is identical to module 20 described above, except for the omission of any cable clip mounted to the front face.

Further modifications to modules 20, 21 and 120 include switching the locations of the front and rear connectors, or switching the location of the attenuators from the front to the rear. Alternatively, the front and rear connectors do not have to be on opposite sides of the modules. Further, the attenuators can be located on a further panel of the module, or under a removable panel portion or cover.

Having described preferred aspects and embodiments of the present invention, modifications and equivalents of the disclosed concepts may readily occur to one skilled in the art. However, it is intended that such modifications and equivalents be included within the scope of the claims which follow.

What is claimed is:

1. A multi-circuit, impedance transformer module for use with a chassis, the module comprising:

a housing including opposing faces, a plurality of exposed first connectors for connecting to twisted pair cables, a plurality of exposed second connectors for connecting to coaxial cables and a plurality of exposed attenuation pads;

a plurality of circuitry electrically connecting the first connectors and the second connectors including baluns to convert twisted pair wire signals from the first connectors to coaxial cable signals at the second connectors, and to convert coaxial cable signals from the second connectors to twisted pair wire signals at the first connectors, the circuitry including the removable attenuation pads; and the housing including oppositely extending flanges for mounting the module to the chassis.

2. The module of claim 1, wherein the circuitry includes a circuit board extending transversely to the first and second faces.

3. The module of claim 2, wherein the baluns are removably mounted in the circuitry to allow alternative baluns having different levels of impedance to be inserted.

4. The module of claim 1, wherein the second connectors are arranged in a linear array.

5. The module of claim 1, wherein the first connectors each include three posts arranged in a linear array for receiving the three wires of a twisted pair cable.

6. The module of claim 5, further comprising a cable clip on one of the opposing faces adjacent to one of the flanges for receiving and holding cables from the first connectors.

7. The module of claim 1, wherein the first connectors are linearly arranged 3-pin connectors arranged in a linear array for receiving mating 3-pin connectors.

8. The module of claim 1, further comprising a cable clip on one of the opposing faces adjacent to one of the flanges for receiving and holding cables from the first connectors.

9. A digital audio impedance transformer system comprising:

a plurality of digital audio impedance transformer modules, each module including:

a housing including opposing faces, a plurality of exposed first connectors for connecting to twisted pair cables, a plurality of exposed second connectors for connecting to coaxial cables and a plurality of exposed attenuation pads;

a plurality of circuitry electrically connecting the first connectors and the second connectors including baluns to convert twisted pair wire signals from the first connectors to coaxial cable signals at the second connectors, and to convert coaxial cable signals from the second connectors to twisted pair wire signals at the first connectors, the circuitry including the removable attenuation pads; and the housing including oppositely extending flanges for mounting the module to the chassis;

the chassis holding a plurality of the modules, a fastener mounting each flange of each module to the chassis.

10. The system of claim 9, wherein the circuitry includes a circuit board extending transversely between the opposing faces.

11. The system of claim 9, wherein the baluns are removably mounted in the circuitry to allow alternative baluns having different levels of impedance to be inserted.

12. The system of claim 10, wherein the second connectors are arranged in a linear array.

13. The system of claim 12, wherein the first connectors are 3-pin connectors arranged in a linear array for receiving a mating 3-pin connector.

14. The system of claim 12, wherein the first connectors each include three posts arranged in a linear array for receiving the three wires of a twisted pair cable.

15. The system of claim 14, wherein a cable clip in mounted on one of opposing faces adjacent to one of the flanges for receiving and holding cables from the first connectors.

16. A multi-circuit, impedance transformer module for use with a chassis, the module comprising:

a housing including a plurality of exterior faces, a plurality of exposed first connectors linearly arranged for connecting to twisted pair cables, each of the first connectors including three contacts aligned linearly arranged in a line parallel to the line of the first connectors, a plurality of exposed second connectors for connecting to coaxial cables, the second connectors linearly arranged in a line parallel to the line of the first connectors;

a plurality of circuitry electrically connecting the first connectors and the second connectors including baluns to convert twisted pair wire signals from the first connectors to coaxial cable signals at the second connectors, and to convert coaxial cable signals from the second connectors to twisted pair wire signals at the first connectors; and the housing including oppositely extending flanges for mounting the module to the chassis.

* * * * *

UNITED STATES PATENT AND TRADEMARK OFFICE

CERTIFICATE OF CORRECTION

PATENT NO. : 6,717,486 B2
DATED : April 6, 2004
INVENTOR(S) : Khemakhem et al.

It is certified that error appears in the above-identified patent and that said Letters Patent is hereby corrected as shown below:

Column 8,
Line 4, "clip in" should read -- clip is --

Signed and Sealed this

Ninth Day of November, 2004

JON W. DUDAS
*Director of the United States Patent and Trademark Office*